(12) United States Patent
Cordes et al.

(10) Patent No.: US 7,099,585 B2
(45) Date of Patent: Aug. 29, 2006

(54) MEMORY CIRCUIT WITH AN OPTICAL INPUT

(75) Inventors: Eric Cordes, München (DE); Georg-Erhard Eggers, München (DE); Christian Stocken, Grünwald (DE)

(73) Assignee: Infineon Technologies AG, Munich (DE)

( * ) Notice: Subject to any disclaimer, the term of this patent is extended or adjusted under 35 U.S.C. 154(b) by 592 days.

(21) Appl. No.: 10/210,741

(22) Filed: Jul. 31, 2002

(65) Prior Publication Data

US 2003/0026141 A1 Feb. 6, 2003

(30) Foreign Application Priority Data

Jul. 31, 2001 (DE) ................................ 101 37 344

(51) Int. Cl.
*H04B 10/20* (2006.01)
(52) U.S. Cl. .......................................... 398/60; 398/91
(58) Field of Classification Search .................. 398/91, 398/60; 257/723, 504, 17
See application file for complete search history.

(56) References Cited

U.S. PATENT DOCUMENTS

| 5,708,297 | A | * | 1/1998 | Clayton | ...................... 257/723 |
| 6,177,684 | B1 | * | 1/2001 | Sugiyama | ..................... 257/17 |
| 2003/0117066 | A1 | * | 6/2003 | Silvernail | .................... 313/504 |

FOREIGN PATENT DOCUMENTS

WO    WO 92/22904    12/1992

OTHER PUBLICATIONS

Meier, et al.: Dynamic RAM Controller Pushes System Speed to 10 MHz—and Beyond, Design Entry, Electronic Design, Apr. 4, 1985, pp. 205-208, 210 and 212.

* cited by examiner

*Primary Examiner*—David C. Payne
(74) *Attorney, Agent, or Firm*—Laurence A. Greenberg; Werner H. Stemer; Ralph E. Locher

(57) ABSTRACT

A memory circuit includes a plurality of memory cells, an input/output area for addressing or writing onto the plurality of memory cells by means of electrical signals, and an optical-electrical converter for converting optical signals into the electrical signals, the plurality of memory cells and the input/output area being integrated on a chip, and the optical-electrical converter being mechanically connected to the chip or being integrated into the chip.

15 Claims, 6 Drawing Sheets

MEMORY CIRCUIT WITH AN OPTICAL INPUT

BACKGROUND OF THE INVENTION

1. Field of the Invention

The present invention relates to electronic memory circuits and in particular to a memory circuit with an optical input.

2. Description of the Related Art

Electronic memory circuits for storing information and data in a binary form are subject to constant and rapid technological progress. On the one hand, their capacities, i.e. the amount of information that can be stored, are being increased more and more. On the other hand, these memory circuits designed as semiconductor components become increasingly fast, i.e. the time required for a writing operation or a reading operation is becoming increasingly short, and/or the number of the elementary writing operations and/or reading operations per time unit is increasing. Here a limit has been reached which is formed by the physically possible range of electric transmission of addressing signals, control signals and data signals.

With an increasing frequency of the signals transmitted to and from a memory circuit, the problems encountered in electrical connections due to parasitic inductances and capacitances as well as due to a cross-talk between adjacent lines increase, whereby signal qualities deteriorate. In addition, each change in the impedance along a signal path causes disturbances in the form of reflections. Each end of a conductor line, each solder contact, each pin-and-socket connection and each wire bond connection may cause, in this manner, disturbing reflections which cause a significant deterioration of the quality of the signals transmitted. In practice, numerous transitions in the form of solder contacts or pin-and-socket contacts occur between a semiconductor chip, a circuit board, a plug-in module and another semiconductor chip.

A deterioration of a signal quality may be compensated, within certain limits, by expensive circuits at the end of a line degrading the signal quality, i.e. at the input area of a circuit receiving the signals, whereby, however, significant cost due to a consumption of further chip space as well as other disadvantages, such as an increased energy consumption, are created.

Special problems with regard to the signal quality arise in testing semiconductor memory circuits during manufacturing. To recognize faulty memory circuits and to remove them from the manufacturing process as early on as possible, they are temporarily contacted by means of testing needles and checked for their function by means of a testing device immediately after their production, while they are still on the entire semiconductor wafer, i.e. before being diced. However, these testing needles have a finite bandwidth which is not sufficient to test modern memory circuits with the signal frequency and the data throughput to which they will be exposed as a finished memory component, for example in a computer. Therefore such a test of a memory component on a wafer can only have limited validity. As a consequence, faulty memory circuits on a wafer are not recognized as such and discarded from the manufacturing process, but are housed, contacted and retested in further costly process steps. In this manner, considerable manufacturing costs arise for memory components which are not functional and therefore cannot be sold, but must be destroyed. These costs must be apportioned to the fault-free components to be sold, whereby they become considerably more expensive.

In addition, all electrical lines, for example on a mother board, a memory socket, a memory module etc., represent antennas which, on the one hand, send out potential spurious signals for other electrical lines and circuits, and, on the other hand, receive spurious signals of other electrical lines or circuits and supply same to the circuits connected. This problem takes on considerable proportions since there is a tendency, for various reasons, to concentrate an increasing number of lines, which transmit signals clocked at an increasing speed, to a decreasing amount of space.

A further problem is an influence on the signal quality by disturbances of a supply voltage, inevitable in practice, which influence, for example, the signal edges and/or their steepness (ground bounce, Vcc drops, etc.).

A further problem arises in a run length adjustment, which leads to additional parasitic capacitances and inductances in the case of an electrical realization.

Each open electrical contact of a semiconductor circuit further presents the risk of a destruction of the semiconductor circuit by an electrostatic discharge (ESD), whereby a semiconductor circuit may be irreparably damaged with each manipulation, in particular when it is inserted into or removed from a circuit board and/or a socket.

Generally, it can be established that each electrical connection in the form of a conductor line, a solder, plug-in or wire bonding connection causes manufacturing expense and thus raises the price of the respective final product and further represents a potential source of trouble in the production and operation.

SUMMARY OF THE INVENTION

It is the object of the present invention to provide an improved concept for memories.

In accordance with the present invention, a memory circuit includes a plurality of memory cells, an input/output area for addressing or writing onto the plurality of memory cells by means of electrical signals, and an optical-electrical converter for converting optical signals into the electrical signals, the plurality of memory cells and the input/output area being integrated on a chip, and the optical-electrical converter being mechanically connected to the chip or being integrated into the chip.

In this memory circuit, the optical-electronic converter may comprise a plurality of optical inputs. Further, the optical-electronic converter may be provided for converting optical signals which are dissimilar to each other and have dissimilar wavelengths to associated electrical signals which are dissimilar to each other. In addition, the optical-electronic converter may be provided for converting optical signals having three dissimilar intensities into three dissimilar associated electrical signals.

The memory circuit described may further include an electrical-optical converter for converting electrical read signals from memory cells into optical signals, the electrical-optical converter being mechanically connected to the chip or being integrated in the chip.

The electrical-optical converter may comprise a plurality of optical outputs. In addition it may be provided for converting dissimilar electrical signals into associated optical signals with at least two dissimilar wavelengths, or for converting three dissimilar electrical signals from the input/output area into three optical signals having three dissimilar intensities.

The electrical-optical converter may comprise an organic light-emitting diode, a light-emitting GaAs diode, a GaAs laser diode or a quantum island in the chip.

In accordance with the present invention, a method for producing a memory circuit includes a step of producing a plurality of memory cells on a chip, a step of producing an input/output area on the chip, a step of producing an electrical connection between the plurality of memory cells and the input/output area, and a step of mechanically connecting or integrating an optical-electrical converter to or into the chip.

In accordance with the present invention, a socket for connecting an electronic circuit to a memory circuit having an optical input includes an electrical-optical converter for converting electrical signals of the electronic circuit into an optical signal, an optical transmission means for transmitting the optical signals, the optical transmission means being mechanically connected to the socket, and an interface for supplying the optical signals to the optical input of the memory circuit and for mechanically accommodating the memory circuit.

In accordance with the present invention, a socket may further comprise an further interface for mechanically accommodating a further memory circuit and for supplying the optical signals to an optical input of the further memory circuit, the optical transmission means being further provided for transmitting the optical signals or further optical signals to the further interface. If the socket in accordance with the present invention comprises a plurality of interfaces, these are preferably arranged in a stack.

In accordance with the present invention, a method for transmitting signals to a memory circuit with a plurality of memory cells and an input/output area for addressing, writing onto and reading from the plurality of memory cells by means of electrical signals comprises a step of converting the signals into optical signals, a step of transmitting the optical signals to the input/output area of the memory circuit, and a step of converting the optical signals into the electrical signals.

In accordance with the present invention, a computer includes a processor, a memory control electrically connected to the processor, a first electrical-optical and optical-electrical converter, electrically connected to the addressing means, for converting first electrical signals from the memory control into first optical signals and for converting second optical signals into second electrical signals for the memory control, an optical transmission means, optically connected to the electrical-optical and optical-electrical converter, for transmitting the first optical signals and the second optical signals, a second electrical-optical and optical-electrical converter, optically connected to the optical transmission means, for converting the first optical signals into third electrical signals and for converting fourth electrical signals into the second optical signals, and a memory circuit having a plurality of memory cells and an input/output area for addressing or writing onto the plurality of memory cells by means of the third electrical signals and for outputting the fourth electrical signals when reading the plurality of memory cells, the plurality of memory cells and the input/output area being integrated on a chip, and the optical-electrical converter being mechanically connected to the chip or being integrated into the chip.

In accordance with the present invention, a probe device for a wafer tester for testing a wafer having a memory circuit with an optical input includes an input for receiving an electrical test signal from the wafer tester, an electrical-optical converter for converting the electrical test signal into an optical signal, an optical transmission means for transmitting the optical signal, and an optical interface for supplying the optical signal to the optical input of the memory circuit.

In the probe device according to the present invention, provision may further be made for the optical interface for picking up or leading off a further optical signal from an optical output of the memory circuit, and for the optical transmission means for transmitting the further optical signal, the probe device further including an optical-electrical converter for converting the further optical signals into an electrical response signal, and an output for outputting the electrical response signal to the wafer tester.

In accordance with the present invention, a method for testing a memory circuit with a plurality of memory cells and an input/output area for addressing, writing onto and reading from the plurality of memory cells by means of electrical signals includes a step of producing electrical test signals, a step of converting the electrical test signals into optical signals, a step of transmitting the optical signals to the input/output area of the memory circuit, and a step of converting the optical signals into the electrical signals.

The inventive method for testing a memory circuit may further include a step of producing electrical response signals in response to the electrical signals in the memory circuit, a step of converting the electrical response signals into further optical signals by means of the memory circuit, a step of transmitting the further optical signals from the input/output area of the memory circuit to an analyzing means, a step of converting the further optical signals into further electrical signals, and a step of analyzing the further electrical signals with a view to a correct functioning of the memory circuit.

The present invention is based on the findings that all above problems associated with a conventional electrical transmission of signals to and from a memory circuit by means of optical transmission may be resolved or at least considerably reduced if a conversion of the optical signals into electrical signals for the memory circuit is directly effected on the chip of the memory circuit, i.e. if an optical-electrical and an electrical-optical converter is integrated into the chip or is directly mounted on the chip or is mechanically connected to same.

Apart from the advantages which are known from the transmission of optical signals over many meters, kilometers or thousands of kilometers by means of optical waveguides and result from the fact that dispersion and signal attenuation are considerably reduced in comparison with an electrical transmission, the inventive optical transmission of signals directly from and/or to the memory circuit comprises a number of advantages which are very specific to the transmission of signals to and from memory circuits. Numerous changes and/or disturbances in the line impedance at transitions between circuit boards and plug-in modules, at pin-and-socket, solder and wire bonding connections, for example, are specific for the wiring of memory circuits. Optical transmission of signals avoids this problem to a very large extent. A cross-talk between adjacent lines arranged, as a rule, extremely close to each other, which occurs in electrical lines due to parasitic inductances and capacitances can be prevented in a very simple manner in optical transmission paths, for example by a light-proof coating or even by a very small spatial spacing.

Further, a run-length adaptation is possible with optical waveguides without significant signal falsification or signal distortion and without creating the additional parasitic capacitances and inductances arising in the case of an electrical realization.

In addition, several conventional electrical lines may be replaced by an optical transmission path by means of a simultaneous use of several colors and/or wavelengths, wherein mutual influence is excluded or can be excluded with very simple means. Instead of using one binary intensity coding, wherein a differentiation is made between only two states (light on, light off) associated with zero and one, respectively, it is possible, in the case of an optical transmission, to use a trinary, quaternary or higher intensity coding, i.e. a system having three, four or more states (no intensity, half of maximum intensity, maximum intensity and/or no intensity, a third of the maximum intensity, two-thirds of the maximum intensity, maximum intensity, etc.). This results in a further increase in the transmission capacity in comparison with an electrical transmission, wherein typically a transmission of data which is intensity-coded in a binary manner is required and/or preferred out of consideration for signal quality.

The use of different wavelengths and of a system having more than two states allows for a considerable reduction in the number of optical inputs/outputs and of the optical transmission paths associated with them, whereby manufacturing costs may be saved.

A memory circuit having an optical input/output may further be designed with only two electrical contacts for current supply, which contacts may furthermore be protected against harmful potentials in a simple manner. In this way, the problem of a potential destruction of the memory circuit by an electrostatic discharge in the manipulation of the memory circuit, for example during insertion into a socket, is fully avoided. All advantages described are achieved even with simple optical connections, e.g. via plastic fibers, which allow markedly increased transmission rates even in comparison with electrical conductor lines.

A special advantage of a memory circuit having an integrated or a directly-mounted optical-electrical and/or electrical-optical converter is that such a memory circuit may already be tested immediately after its production on a wafer by means of an optical probe under the conditions of its later operation, i.e. at a signal rate and a data throughput corresponding to the conditions of the later operation. Thus, a memory circuit in accordance with the present invention may already be fully tested at the earliest possible point in time and be discarded from the manufacturing process in the event of a malfunction, whereby cost for further process steps, for example dicing, contacting, provision with a new housing and retesting, may be saved.

A further advantage making itself felt in particular with the socket in accordance with the present invention is that an insertion of a memory circuit 2 into an interface 42 of the socket 40 does not have any repercussion on the quality of optical signals at other interfaces 42 of the socket 40.

BRIEF DESCRIPTION OF THE DRAWINGS

In the following, preferred embodiments of the present invention will be explained in more detail with reference to the accompanying drawings, wherein.

DESCRIPTION OF THE PREFERRED EMBODIMENTS

Figure 1:
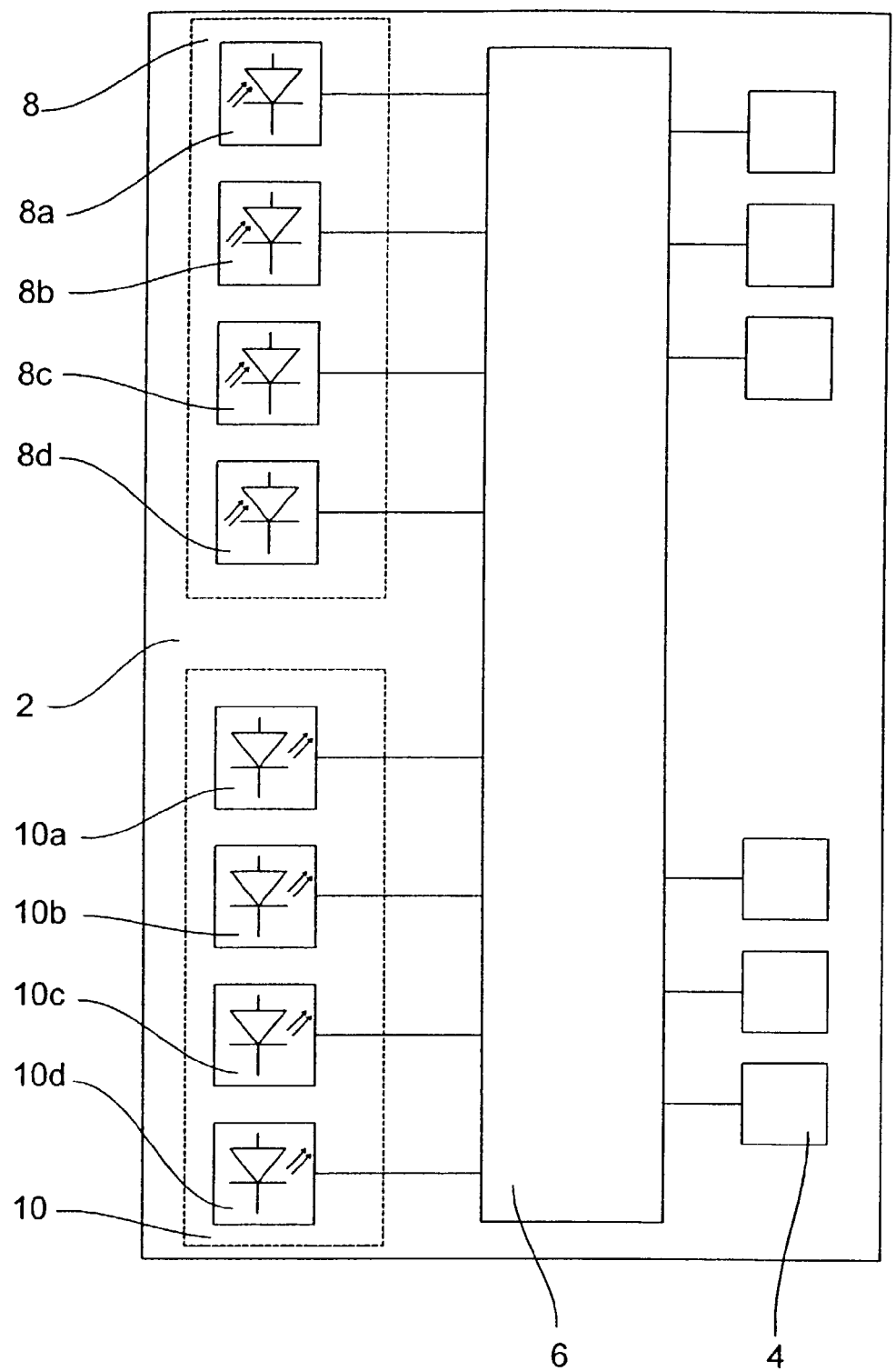
FIG. 1 shows a schematic block diagram of a memory circuit in accordance with the present embodiment.

FIG. 1 is a schematic block diagram of a memory circuit 2 comprising a plurality of memory cells 4 and an input/output area (I/O area) 6. The plurality of memory cells 4 are provided for storing a corresponding plurality of binary values. The I/O area 6 is provided for addressing, writing onto or reading from the plurality of memory cells by means of electrical signals and is therefore electrically connected to the plurality of memory cells in each case. The memory circuit 2 corresponds to conventional memory circuits, which are manufactured in large quantities and with an ever-increasing number of memory cells per memory circuit, so as to be used, for example, in computers and in a multiplicity of other digital electronic devices for storing information in the form of figures presented in digital form.

A conventional memory circuit is connected, via a plurality of electrical control, address and data lines, to a memory control, a processor or a central processing unit or another electronic circuit writing, via the I/O area 6, digital values into the memory cells 4 or reads from them. To this end, the I/O area 6 comprises a plurality of electrical contacts connected, by means of a wire bonding technique, for example, to connector pins or solder pads on a housing containing the memory circuit, the connector pins and/or solder pads of the housing in turn being electrically connected to other electronic components by means of electrical conductor lines on a circuit board or a plug-in module, by means of further solder or pin-and-socket connections and/or cables.

In the memory circuit 2 in accordance with the present invention, the I/O area 6 is directly connected to an optical-electrical converter 8 and an electrical-optical converter 10. The optical-electrical converter 8 comprises a plurality of light-sensitive electronic components $8a, \ldots, 8d$, which are electrically connected to one electrical input of the I/O area 6, respectively. The electrical-optical converter 10 comprises a plurality of electrically controllable light sources $10a, \ldots, 10d$ which are electrically connected to one electrical output of the I/O area 6, respectively. The memory cells 4 and the I/O area 6 are integrated on a semiconductor chip. The optical-electrical converter 8 and the electrical-optical converter 10 are also integrated in the chip or glued, soldered or bonded to the chip or mechanically and electrically firmly connected to the chip in another manner.

The light-sensitive electronic components $8a, \ldots, 8d$ may be semiconductor photodiodes, photoelements or other electronic components producing an electrical signal which is dependent on an intensity of a light signal received. The electrically controllable light sources $10a, \ldots, 10d$ may be for example, light-emitting GaAs diodes or other semiconductor diodes, GaAs laser diodes or other semiconductor laser diodes, constant light sources having constant light emission and downstream intensity-modulating components, or other light sources, the light emission of which may be controlled electrically. The labeling of the light-sensitive electronic components $8a, \ldots, 8d$ with circuit symbols for photodiodes, and of the electrically controllable light sources 10a, ..., 10d with circuit symbols for light-emitting diodes therefore serves illustration purposes only and is to be regarded as being merely exemplary.

If the memory circuit 2 is implemented in silicon, a light-emitting diode may not be readily integrated into the chip of the memory circuit 2 on account of the indirect band transition in Si. A cheap possibility, which may easily be integrated into existing manufacturing processes, is the organic light-emitting diode. A GaAs diode or GaAs laser diode grafted onto the Si chip represents a good solution in terms of quality, it is, however, more complex and more expensive in terms of production. One possibility of realizing a light-emitting diode in Si is to construct quantum island or structures in the Si crystal which achieve a suitable bending in the tape structure of Si (see e.g. c't July 2001, Wai Lek Ng, M. A. Lourenco, R. M. Gwilliam, S. Ledian, Ü. G. Shao & K. P. Homewood, "An efficient room-temperature silicon-based light emitting diode", Nature Vol. 410, Aug. 3, 2001, p. 192).

Each light-sensitive electronic component 8a, ..., 8d is provided for being connected, by means of an optical transmission means, to a light source which sends an optical signal. Each light-sensitive electronic component 8a, ..., 8d converts an optical signal received into an electrical signal which is supplied to the input of the I/O area 6 connected to it. Each light-sensitive electronic component 8a, ..., 8d, or its light-sensitive area, thus represents an optical input of the memory circuit 2. The optical signals sent to the light-sensitive electronic components 8a, ..., 8d have various functions. Some of the light-sensitive electronic components 8a, ..., 8d receive control signals and/or status signals provided for controlling the I/O area 6, or the functions implemented in the same. Others of the light-sensitive electronic components 8a, ..., 8d receive optical signals defining an address of a memory cell 4 or of a group of memory cells 4 and thus transferring the information, to the I/O area 6, about which memory cell 4 or which group of memory cells 4 is to be written onto or which memory cell 4 or which group of memory cells 4 is to be read from. Others of the light-sensitive electronic components 8a, ..., 8d, receive optical signals representing data which are to be written, in binary representation, into a memory cell 4 or into a group of memory cells 4.

The electrically controllable light sources 10a, ..., 10d send optical signals representing control signals and/or status signals or data which have been read from a memory cell 4 or from a group of memory cells 4. Some of the electrically controllable light sources 10a, ..., 10d send control signals and/or status signals which transfer, for example, information about the state of the memory circuit 2 to the receiver of the optical signals. Others of the electrically controllable light sources 10a, ..., 10d send optical signals by means of which data read out from a memory cell 4 or from a group of memory cells 4 is transferred to a receiver of the optical signal.

Control signals, address signals and data signals, respectively, are preferably sent by different light-sensitive electronic components 8a, ..., 8d or received by different electrically controllable light sources 10a, ..., 10d, which means that each individual light-sensitive electronic component 8a, ..., 8d and each electrically controllable light source 10a, ..., 10d either receives and/or sends only control signals and/or a particular control signal, or exclusively address signals or exclusively data signals.

Each light-sensitive electronic component 8a, ..., 8d and each electrically controllable light source 10a, ..., 10d may either be connected to a dedicated and separate light-transmission means, for example a glass fiber or another optical waveguide, or one light-sensitive electronic component 8a, ..., 8d and one electronically-controllable light source 10a, ..., 10d may be connected to one and the same light-transmission means. If the light-sensitive electronic components 8a, ..., 8d and the electronically-controllable light sources 10a, ..., 10d, as well as corresponding components and light sources at an electronic circuit with which the memory circuit 2 is connected via an optical transmission means, are selective in terms of wavelengths, i.e. if each electrically controllable light source 10a, ..., 10d emits only light of a specific wavelength, and each light-sensitive electronic component 8a, ..., 8d converts only light of a specific wavelength into an electrical signal, several light-sensitive electronic components 8a, ..., 8d and/or electrically controllable light sources 10a, ..., 10d, which are each selective for light wavelengths dissimilar to each other may be connected to one and the same light-transmission means.

Figure 2:
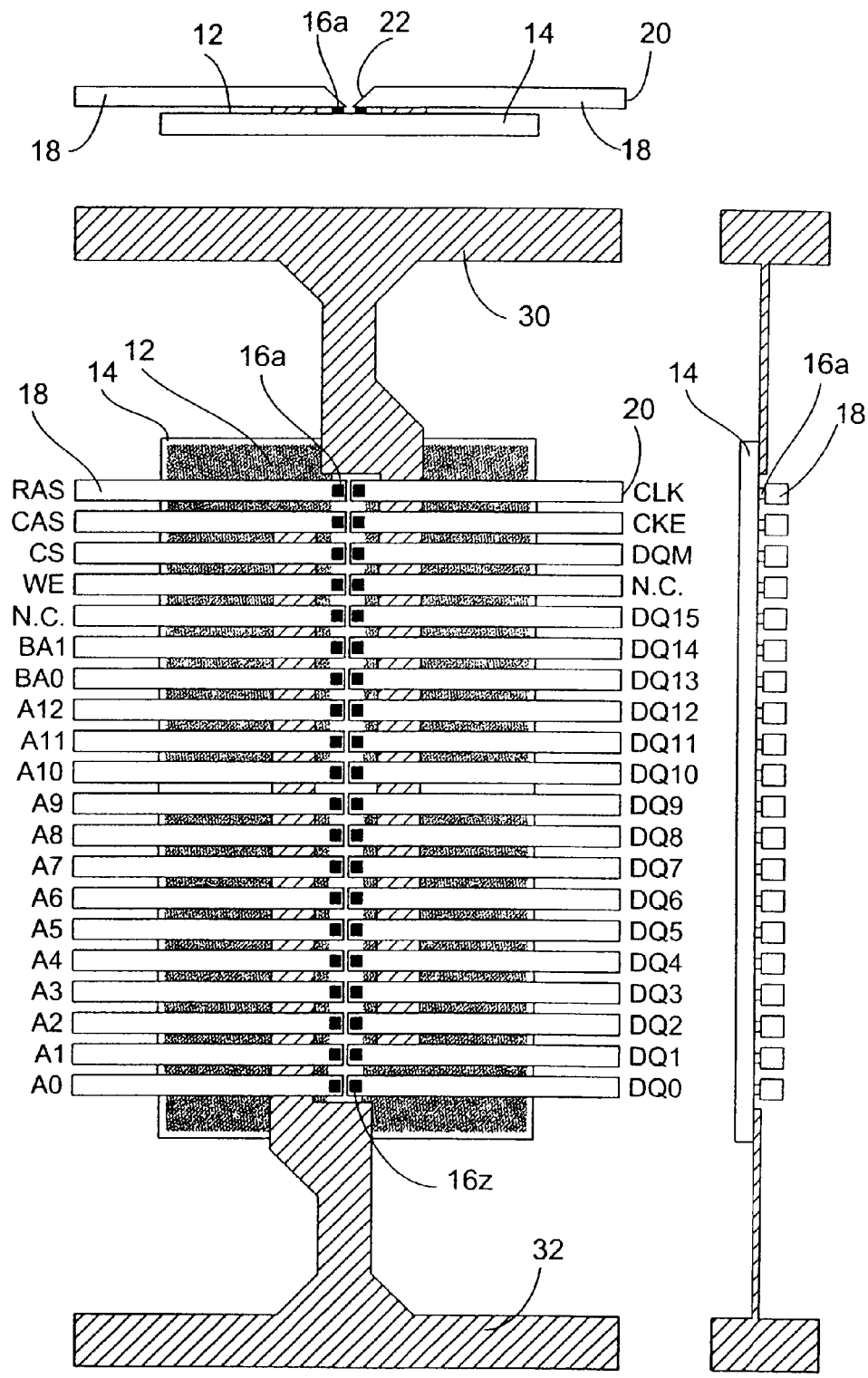
FIG. 2 shows a schematic representation of a preferred embodiment of the memory circuit in accordance with the present invention.

FIG. 2 is a schematic representation of a preferred embodiment of the memory circuit in accordance with the present invention. A top view of the memory circuit is shown in the center, and cross-sections of same are represented on the right and at the top. A plurality of converter elements 16a to 16z are arranged on a surface 12 of a semiconductor chip 14, which converter elements are each connected to an optical waveguide 18 such that light which is coupled into the optical waveguide 18 via an optical interface 20 of same impinges upon the associated converter element 16a ..., 16z following a reflection at a reflecting surface which deflects the light by 90°, and such that, conversely, light emanating from a converter element 16a, ..., 16z is coupled out at the optical interface 20 of the optical waveguide 18 following a reflection at the reflecting surface 22 of the associated optical waveguide 18. Each converter element 16a, ..., 16z comprises one of the light-sensitive electronic components 8a, ..., 8d of FIG. 1 and/or one of the electrically controllable light sources 10a, ..., 10d of FIG. 1 so that it may receive and/or send optical signals via the optical waveguide 18. Each converter element 18a, ..., 18z is associated, along with its optical waveguide 18, with a certain function which is characterized, in each case, in FIG. 2 by a combination of letters and figures at the optical interface 20, which letters and figures are also known from conventional memory circuits.

The memory circuit of FIG. 2 further comprises two electrically conductive members 30, 32 via which the memory circuit 2, including the memory cells not represented in FIG. 2, the input/output area which is arranged directly below the converter elements 16a, ..., 16z and which is also not represented, and including the converter elements 16a, ..., 16z, is supplied with electrical power. The entire memory circuit 2 is provided with a housing which is also not represented and at the long narrow sides of which the optical interfaces 20 are exposed, and at the short narrow sides of which the electrically conductive members 30, 32 are exposed.

Figure 3:
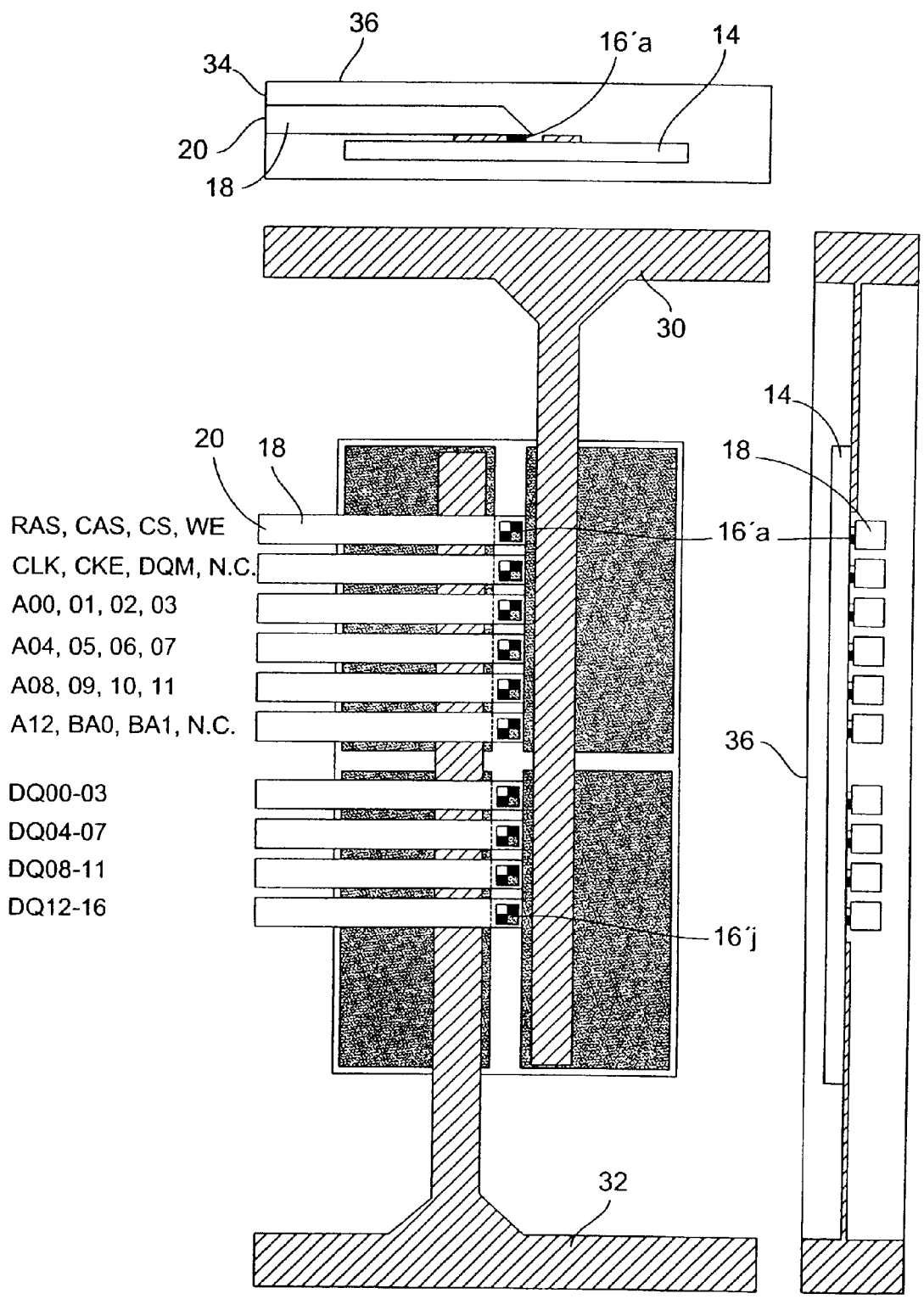
FIG. 3 shows a schematic representation of a further preferred embodiment of the memory circuit in accordance with the present invention.

FIG. 3 is a schematic representation of a further preferred embodiment of a memory circuit in accordance with the present invention. Here, again, a top view of the memory circuit is shown in the center, and two cross-sectional views are shown on the right and at the top. The memory circuit of FIG. 3 differs from that of FIG. 2 in that it includes a smaller number of converter elements 16'a, ..., 16'j and a correspondingly smaller number of optical waveguides 18. The converter elements 16'a, ..., 16'j of the embodiment represented in FIG. 3 differ from the converter elements 16a, ..., 16z of the embodiment shown in FIG. 2 in that they comprise, in each case, four light-sensitive electrical components and/or four electrically controllable light sources which are selective with regard to four different light wavelengths. Thus, four signals may be sent and/or received and/or transmitted simultaneously via one converter element 16'a, ..., 16'z and an associated light waveguide 18, which may be seen from the abbreviations of letters and figures which are shown at the optical interfaces 20 of the optical waveguides 18 and which characterize the different signals. The significantly reduced number of converter elements 16'a, ..., 16'j and, in particular, of light waveguides 18 considerably reduces the manufacturing expense and the manufacturing cost and further readily allows that all optical interfaces 20 of the optical waveguides 18 are located at a side face 34 of a housing 36, which considerably simplifies the construction of an interface accommodating the memory circuit 2 with the housing 36.

Figure 4:
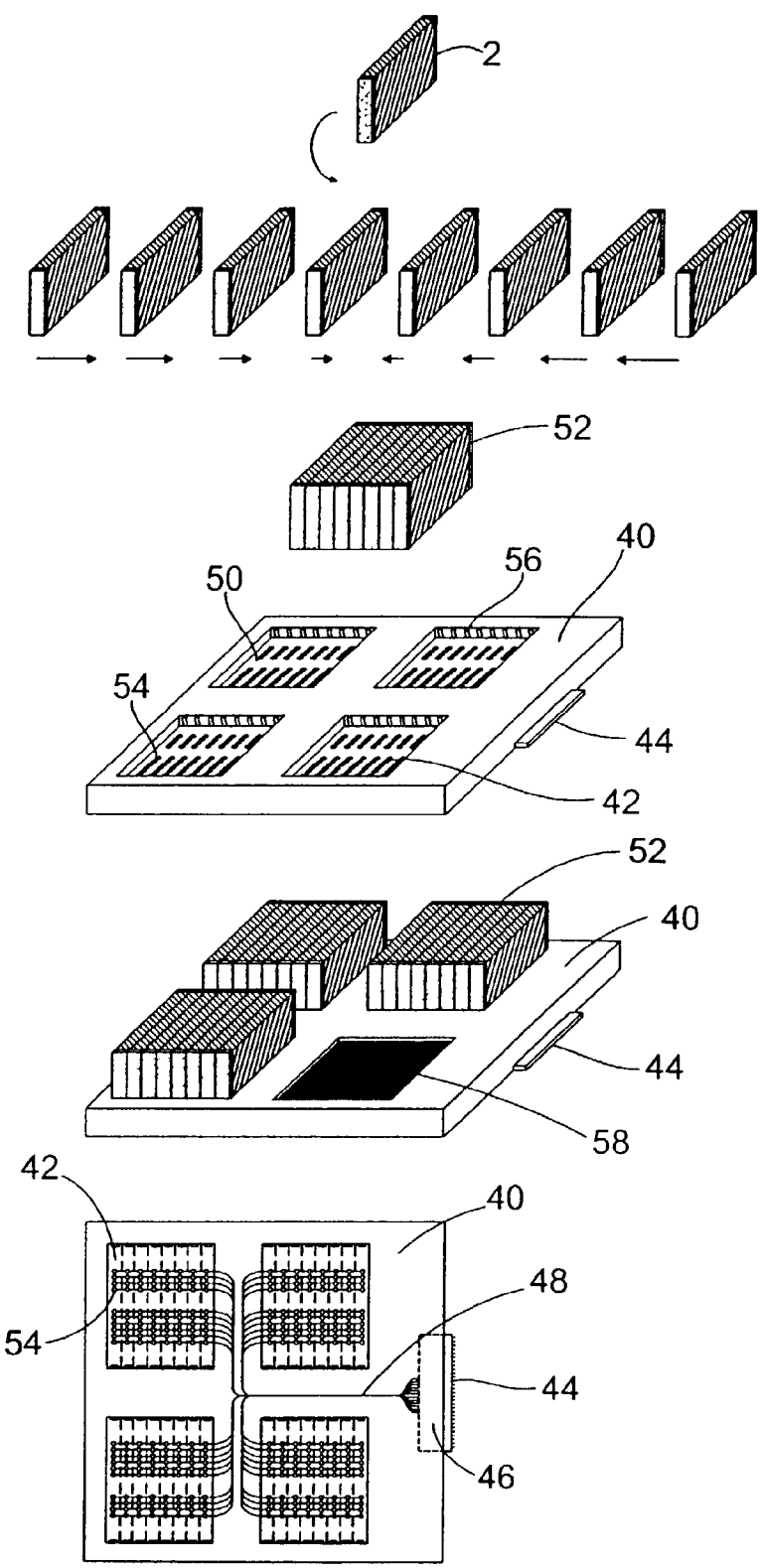
FIG. 4 shows a schematic representation of an embodiment of a socket in accordance with the present invention.

FIG. 4 is a schematic representation of a socket 40 comprising a plurality of interfaces 42 for one memory circuit 2 each, as is shown in FIG. 3. The socket 40 includes electrical contacts 44 provided for being connected to electronic components (not shown), for example a set of chips of a computer or to an electrical bus. The electrical contacts 44 are directly connected to an electrical-optical and optical-electrical converter 46 converting electrical signals which are supplied to the socket 40 via the electrical contacts 44 into optical signals and coupling them into a bundle of optical waveguides 48.

The socket comprises four depressions, or recesses, 50 in which eight interfaces 42 are arranged, respectively, in the form of a stack. The recesses 50 are designed such that they can each accommodate a stack 52 of eight memory circuits 2. The optical waveguides 48 are distributed among all four recesses 50 and, there, lead to optical interfaces 54 which are designed and arranged such that optical signals from the electrical-optical and optical-electrical converter 46 are supplied to the memory circuits 2, or their converter elements 16a, ..., 16j, via the optical interfaces 54 of the socket 40 and the optical interfaces 20 of the memory circuits 2 (see FIG. 3) and that, conversely, optical signals from the converter elements 16a, ..., 16f of the memory circuits 2 are supplied to the electrical-optical and optical-electrical converter 46 via the optical interfaces 20 of the memory circuits 2, the optical interfaces 54 of the socket 40 and the optical waveguides 48. Thus, the socket 40 mechanically accommodates, at the same time, the memory circuits 2 and/or the stacks 52 of memory circuits 2 and establishes an optical signal connection between the electrical contacts 44 and the optical interfaces 20 of the memory circuits 2. In addition, each recess 50 comprises a plurality of supply voltage contacts 56 arranged such that they engage with the electrically conductive members 30, 32 of the memory circuits 2. The supply voltage contacts 56 are connected to a group of the electrical contacts 44 of the socket 40, via which contacts the socket may be connected to a power supply, such that a supply voltage may be supplied to the memory circuits 2 via this group of the electrical contacts 44, the voltage supply contacts 56 and the electrically conductive members 30, 32.

The memory circuits 2 are inserted into the socket 40 by being inserted into the recesses 50 preferably in the form of stacks 52 of eight memory circuits 2 each. A recess 50, into which no stack 52 of memory circuits 2 is inserted, is preferably terminated with a light cover 58.

As a deviation from the embodiment represented in FIG. 4, a socket 40 may comprise, in accordance with the present invention, a different number of recesses 50 and a different number of interfaces 42 per recess 50, or recesses with different numbers of interfaces 42.

In the socket 40 of FIG. 4, the optical interfaces 42 may be connected, as is represented, at least in groups to the same optical waveguides 48, respectively, or all interfaces may be connected to the same optical waveguides 48, or each interface 42 may be connected to a different sub-group, or combination, of optical waveguides.

Figure 5:
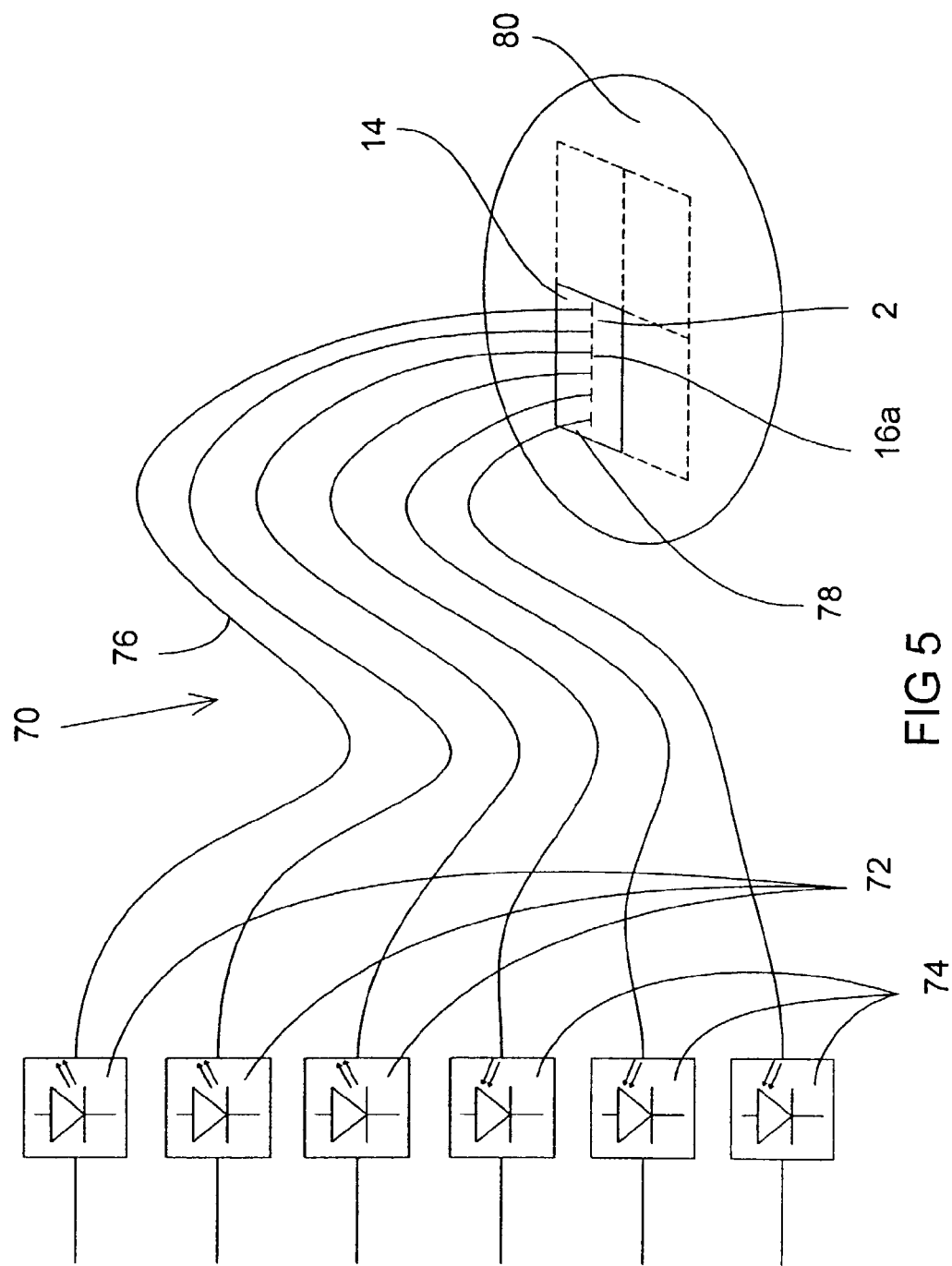
FIG. 5 shows a schematic representation of a probe device for a wafer tester in accordance with the present invention.

FIG. 5 is a schematic representation of a probe device 70 for a wafer tester (not represented). The probe device 70 comprises a plurality of electrical-optical converters 72 and a plurality of optical-electrical converters 74, which may be electrically connected to test-signal outputs and/or inputs of the wafer tester for response signals. The electrical-optical converters 72 and the optical-electrical converters 74 are connected to one end of an optical waveguide 76, respectively, and the other ends, respectively, of the optical waveguides 76 are mechanically interconnected by means of a frame (not represented) in such a rigid manner that they may be moved together and that their spatial arrangement corresponds to that of converter elements 16a, ..., 16z of a memory circuit 2 on a chip 14. In this manner, the optical interfaces 78 of the optical waveguides 76 may be arranged simply, quickly and simultaneously opposite to the converter elements 16a, ..., 16z of the memory circuit 2.

Thus, the probe device 70 enables test signals of a wafer tester to be coupled into the converter elements 16a, ..., 16z of the memory circuit 2 on the chip 14, which is part of a wafer 80, and enables response signals from converter elements 16a, ..., 16z of the memory circuit 2 to be coupled out and to be transmitted to the wafer tester and/or an analyzing means of same which analyses the response signals of the memory circuit 2 for a correct functioning of the memory circuit 2. The optical transmission of the test signals and the response signals enables a considerably increased bandwidth in comparison with a conventional electrical probe of a wafer tester. In particular, it is possible, with the probe device 70, for the memory circuit 2 to undergo a test under the conditions of the later use of the memory circuit while still being on the wafer 80, in particular with the same data throughput and/or the same signal rate for which it is designed and to which it will be exposed during operation. In this manner, the probe device 70 allows faulty memory circuits 2 to be recognized and discarded immediately after their production and before the performance of further costly process steps.

Figure 6:
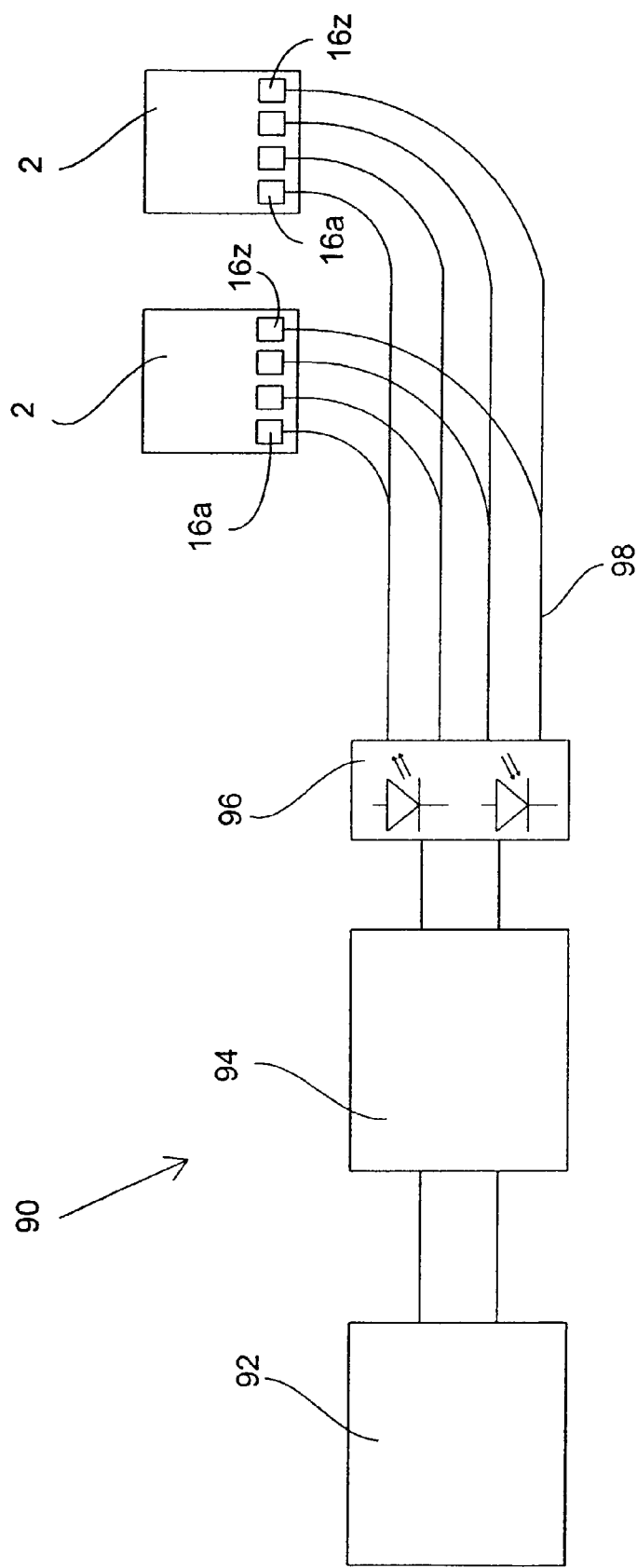
FIG. 6 shows a schematic representation of a computer in accordance with the present invention.

FIG. 6 shows a schematic representation of a computer 90 in accordance with the present invention, comprising a processor or a central processing unit (CPU) 92, a memory control 94, an electrical-optical and optical-electrical converter 96 and one or several memory circuits 2 in accordance with the embodiments represented above. The CPU 92 is electrically connected to the memory control 94, the memory control 94 is electrically connected to the electrical-optical and optical-electrical converter 96, and the electrical-optical and optical-electrical converter 96 is optically connected to the memory circuits 2. Data to be stored in one of the memory circuits 2 is transmitted from the CPU 92 to the memory control 94 in the form of electrical signals together with information about the memory location. The data to be stored is transmitted to the electrical-optical and optical-electrical converter 96 from the memory control 94 together with a memory address in the form of further electrical signals, which converter 96 converts the further electrical signals into optical signals which are transmitted, via an optical transmission means 98, for example optional waveguides, to converter elements, 16a, ..., 16z of the memory circuits 2, where they are again converted into electrical signals for the I/O areas 6 of the memory circuits 2. In response to these electrical signals for the I/O area 6, the I/O area 6 stores the data in the memory cell(s) associated with the storage address.

Preferably, the computer 90 comprises one or several sockets 40 as has been represented and described with reference to FIG. 4. In this case, the electrical-optical and optical-electrical converter 96 of the computer 90 of FIG. 6 is identical with the electrical-optical and optical-electrical converter 46 of the socket 40 of FIG. 4, and the optical transmission means 98 of the computer 90 is identical with the optical waveguide 48 of the socket 40.

For reading data from one of the memory circuits 2, the CPU 92 transmits, to the memory control 94, a signal containing information about the memory location of the data to be read. The memory control 94 sends a further electrical signal to the electrical-optical and optical-electrical converter 96, which signal contains a read command and the memory address of the data to be read. The electrical-optical and optical-electrical converter 96 converts the further electrical signal into an optical signal transmitted to the converter elements 16a, ..., 16z of a memory circuit by the optical transmission means 98. In the converter elements 16a, ..., 16z the optical signal is converted into an electrical signal for the I/O area 6, which signal contains a read command and the memory address. In response to this electrical signal, the I/O area 6 reads the memory cell 4 or group of memory cells 4 corresponding to the memory address and sends the read signal, which corresponds to the data read out from the memory cells, to converter elements 16a, ..., 16z. There, the read signal is converted into a further optical signal transmitted to the electrical-optical and optical-electrical converter 96 by the optical transmission means 98. The electrical-optical and optical-electrical converter 96 converts the optical signal into a further electrical signal for the memory control 94. The processor obtains, from the memory control, an electrical signal containing the data read.

The memory circuit of FIG. 1, its preferred embodiments of FIGS. 2 and 3, the socket of FIG. 4, the probe device of FIG. 5 and the computer of FIG. 6 have in common the transmission of optical signals directly to and/or from the chip containing the memory circuit, which transmission exhibits the above-mentioned advantages. In particular, it allows a significant increase in the bandwidth of signal transmission, a protection against mutual cross-talk between signal lines, against the creation of spurious signals for other electronic elements, against spurious signals from other elements being coupled in, a protection against a destruction of the memory circuit by an electrostatic discharge, and it offers a possibility of reducing the number of contacts and/or interfaces between the memory circuit and a socket, a far-reaching reduction of the repercussion an occupation of a socket location has on the signal quality at another socket location, and a number of further advantages mentioned above.

As a deviation from the above embodiments, a memory circuit may comprise an electrical-optical or an optical-electrical converter with a different number of light-sensitive electrical components and/or electrically controllable light sources, for example with only one light-sensitive electrical component and/or with only one electrically controllable light source, or with considerably more than the components and/or light sources represented. In addition, an inventive memory circuit may comprise only an optical-electrical converter or only an electrical-optical converter so that information is optically transmitted only in one direction to or from the memory circuit.

Even though predominantly optical waveguides are used as the optical transmission means in the embodiments, other optical means, for example mirrors or lenses, are also conceivable.

What is claimed is:

1. Memory circuit comprising:
   a plurality of memory cells;
   an input/output area for addressing, reading from or writing onto the plurality of memory cells by means of electrical signals;
   a plurality of optical-electrical converters for converting optical signals into the electrical signals, or a plurality of electrical-optical converters for converting the electrical signals into optical signals;
   an electrical-optical converters for an electrical-optical comverter connectable to a single optical waveguide adapted for carrying at least two different wavelengths, each wavelength carrying a different signal of a group of signals, said group of signals including control signals, status signals, address signals and data signals;
   said optical-electrical converter or said electrical-optical converter including a light-sensitive or light-emitting electrical component for each wavelength, each light sensitive or light-emitting component being selective for one of the at least two different wavelengths; and
   said optical-electrical converter being operative to output a plurality of different electrical signals, the different electrical signals carried by the wavelengths, or said electrical-optical converter being operative to output at least two different wavelengths for carrying the different signals;
   the plurality of memory cells and the input/output area being integrated on a chip; and
   said optical-electrical converter or said electrical-optical converter being mechanically connected to the chip or being integrated into the chip.

2. Memory circuit as claimed in claim 1, wherein the optical-electrical converters of said plurality of optical-electrical converters are provided for converting intensity-coded optical signals having more than two different intensities into electrical signals.

3. Memory circuit as claimed in claim 1, wherein the electrical-optical converters of the plurality of optical-electrical converters are provided for converting independent electrical signals into optical signals intensity-coded with more than two intensity states.

4. Memory circuit as claimed in claim 1, wherein the electrical-optical converter comprises an organic light-emitting diode.

5. Memory circuit as claimed in claim 1, wherein the electrical-optical converter comprises a light-emitting GaAs diode or a GaAs laser diode.

6. Memory circuit as claimed in claim 1, wherein the electrical-optical converter comprises a quantum island in the chip.

7. Socket for connecting an electronic circuit to a memory circuit having an optical input or an optical output, the socket comprising:
   plurality of electrical-optical converters for converting electrical signals of the electronic circuit into optical signals or a plurality of optical-electrical converters for converting optical signals into electrical signals for the electronic circuit;

a plurality of optical waveguides for transmitting said optical signals, said optical waveguides being mechanically connected into the socket;

an electrical-optical converter or an optical-electrical converter connected to a single optical waveguide of the plurality of optical waveguides adapted for carrying at least two different wavelengths, each wavelength carrying a different signal of a group of signals, said group of signals including control signals, status signals, address signals and data signals;

each electrical-optical converter being operative to output at least two different wavelengths for carrying said different signal, or each optical-electrical converter being operative to receive at least two different wavelengths for carrying said different signal and to output the electrical signals; and, an interface connected to said plurality of optical waveguides for supplying the optical signals to the optical input of the memory circuit and for mechanically accommodating the memory circuit, or said interface being connected to said plurality of optical waveguides for receiving the optical signals from the optical output of the memory circuit and for mechanically accommodating the memory circuit.

8. Socket as claimed in claim 7, further having a further interface for mechanically accommodating a further memory circuit and for supplying the optical signals or further optical signals to an optical input of the further memory circuit or for receiving the optical signals or further optical signals from an optical output of the further memory circuit, said optical waveguides further being provided for transmitting the optical signals or the further optical signals to or from the further interface.

9. Socket as claimed in claim 8, wherein the interface and the further interface are arranged in a stack so as to accommodate a stack of memory circuits which includes the memory circuit and the further memory circuit.

10. Probe device for a wafer tester for testing a wafer having a memory circuit with an optical input or an optical output, the probe device comprising;

an input for receiving an electrical test signal from the wafer tester or an output for outputting an electrical test signal to the wafer tester;

a plurality of electrical-optical converters for converting the electrical test signals into optical signals or a plurality of optical-electrical converters for converting optical signals into the electrical test signals;

a plurality of optical waveguides for transmitting the optical signal;

an electrical-optical converter or an optical-electrical converter connected to a single optical waveguide of said plurality of optical waveguides adapted for carrying a different signal of a group of signals, said group of signals including control signals, status signals, address signals and data signals;

each electrical-optical converter being operative to output at least two different wavelengths, or each optical-electrical converter being operative to receive at least two different wavelengths; and an optical interface connected to said plurality of optical waveguides, said optical interface adapted for supplying the optical signal to the optical input of the memory circuit or for receiving the optical signals from the optical output of the memory circuit.

11. Computer comprising:
a processor;
a memory control electrically connected to the processor;

a first electrical-optical and optical-electrical converter electrically connected to the memory control for converting first electrical signals from the memory control into first optical signals and for converting second optical signals into second electrical signals for the memory control;

an optical transmission means optically connected to the electrical-optical and optical-electrical converter for transmitting the first optical signals and the second optical signals;

a second electrical-optical and optical-electrical converter optically connected to the optical transmission means for converting the first optical signals into third electrical signals and for converting fourth electrical signals into the second optical signals; and a memory circuit having a plurality of memory cells and an input/output area for addressing or writing onto the plurality of memory cells by means of the third electrical signals and for outputting the fourth electrical signals when reading the plurality of memory cells, the plurality of memory cells and the input/output area being integrated on a chip, and the optical-electrical converter being mechanically connected to the chip or being integrated into the chip.

12. Method for producing a memory circuit, comprising:
producing a plurality of memory cells on a chip;
producing an input/output area on the chip, producing an electrical connection between the plurality of memory cells and the input/output area;

mechanically connecting or integrating a plurality of optical-electrical converters or electrical-optical converters to or into the chip;

an optical-electrical converter or an electrical-optical converter of the plurality being connectable to a single optical waveguide adapted for carrying at least two different wavelengths, each wavelength carrying a different signal of a group of signals, the group of signals including control signals, status signals, address signals and data signals;

the optical-electrical converter or the electrical-optical converter including a light-sensitive or light-emitting electrical component for each wavelength, each light-sensitive or light-emitting component being selective for one of the at least two different wavelengths;

the optical-electrical converter being operative to output a plurality of different electrical signals, the different electrical signals corresponding to the different signals carried by the wavelengths, or the electrical-optical converter being operative to output at least two different wavelengths for carrying the different signals; and producing an electrical connection between the plurality of the optical-electrical converters or the plurality of electrical-optical converters and the input/output area.

13. Method for testing a memory circuit with a plurality of memory cells and an input/output area for addressing, writing onto and reading from the plurality of memory cells by means of electrical signals, the method comprising:

producing electrical test signals;

converting the electrical test signals into optical signals using a plurality of electrical-optical converters;

an electrical-optical converter of the plurality being connected to a single optical waveguide of the plurality of optical waveguides adapted for carrying at least two different wavelengths, each wavelength carrying a different signal of a group of signals, wherein the group of signals includes control signals, status signals, address signals and data signals;

each electrical-optical converter being operative to output at least two different wavelengths;

transmitting the optical signals to the input/output area of the memory circuit using a plurality of optical waveguides; and converting the optical signals into the electrical signals on the input/output area of the memory circuit.

14. Method as claimed in claim 13, further comprising:

creating electrical response signals in response to the electrical signals in the memory circuit;

converting the electrical response signals into further optical signals;

transmitting the further optical signals from the input/output area of the memory circuit to an analyzing means;

converting the further optical signals into further electrical signals; and analyzing the further electrical signals with regard to a correct functioning of the memory circuit.

15. Method for transmitting signals to or receiving signals from a memory circuit with a plurality of memory cells and an input/output area for addressing, writing onto and reading from the plurality of memory cells by means of electrical signals, the method comprising:

converting the signals into optical signals using a plurality of electrical-optical converters or converting the signals from optical signals using a plurality of optical-electrical converters;

an electrical-optical converter or an optical-electrical converter being connected to a single optical waveguide of the plurality of optical waveguides being adapted for carrying at least two different wavelengths, each wavelength carrying a different signal of a group of signals wherein the group of signals includes control signals, status signals, address signals and data signals;

each electrical-optical converter being operative to output at least two different wavelengths or each optical-electrical converter being operative to receive at least two different wavelengths;

transmitting the optical signals to or from the input/output area of the memory circuit; and converting the optical signals into the electrical signals or converting the electrical signals into the optical signals on the input/output area of the memory circuit, the input/output area of the memory circuit including:

a plurality of optical-electrical converters for converting the optical signals into the electrical signals or a plurality of electrical-optical converters for converting the electrical signals into the optical signals;

an optical-electrical converter or an electrical-optical converter being connectable to a single optical waveguide adapted for carrying at least two different wavelengths, each wavelength carrying a different signal of a group of signals, the group of signals including control signals, status signals, address signals and data signals;

the optical-electrical converter or the electrical-optical converter including a light-sensitive or light-emitting electrical component for each wavelength, each light-sensitive or light-emitting component being selective for one of the at least one of the two different wavelengths; and the optical-electrical converter being operative to output a plurality of different electrical signals, the different electrical signals corresponding to the different signals carried by the wavelengths, or the electrical-optical converter being operative to output at least two different wavelengths for carrying the different signals.

* * * * *